(12) United States Patent
Camacho et al.

(10) Patent No.: US 8,536,690 B2
(45) Date of Patent: Sep. 17, 2013

(54) INTEGRATED CIRCUIT PACKAGING SYSTEM WITH CAP LAYER AND METHOD OF MANUFACTURE THEREOF

(75) Inventors: Zigmund Ramirez Camacho, Singapore (SG); Lionel Chien Hui Tay, Singapore (SG); Henry Descalzo Bathan, Singapore (SG); Guruprasad Badakere Govindaiah, Singapore (SG)

(73) Assignee: STATS CHIPPAC Ltd., Singapore (SG)

( * ) Notice: Subject to any disclaimer, the term of this patent is extended or adjusted under 35 U.S.C. 154(b) by 433 days.

(21) Appl. No.: 12/564,852

(22) Filed: Sep. 22, 2009

(65) Prior Publication Data

US 2011/0068448 A1    Mar. 24, 2011

(51) Int. Cl.
   *H01L 23/495* (2006.01)
(52) U.S. Cl.
   USPC .......................................... 257/676; 257/666
(58) Field of Classification Search
   USPC ......................... 257/666, 676, 735, 691, 692
   See application file for complete search history.

(56) References Cited

U.S. PATENT DOCUMENTS

| 5,371,405 | A | 12/1994 | Kagawa |
| 6,366,178 | B1 | 4/2002 | Makino et al. |
| 6,472,737 | B1 * | 10/2002 | Corisis et al. ................. 257/691 |
| 6,608,377 | B2 | 8/2003 | Chang et al. |
| 7,009,297 | B1 | 3/2006 | Chiang et al. |
| 7,087,993 | B2 | 8/2006 | Lee |
| 7,190,080 | B1 | 3/2007 | Leu et al. |
| 7,446,408 | B2 | 11/2008 | Shim et al. |
| 7,468,909 | B2 | 12/2008 | Yano et al. |
| 7,534,630 | B2 | 5/2009 | Saran |
| 7,573,124 | B2 | 8/2009 | Wang et al. |
| 2005/0006730 | A1 * | 1/2005 | Owens et al. ................. 257/666 |
| 2007/0181990 | A1 | 8/2007 | Huang et al. |
| 2009/0146297 | A1 | 6/2009 | Badakere et al. |

* cited by examiner

*Primary Examiner* — Jenny L Wagner
(74) *Attorney, Agent, or Firm* — Ishimaru & Associates LLP (57) ABSTRACT

A method of manufacture of an integrated circuit packaging system includes: attaching a semiconductor die to a die pad of a leadframe; forming a cap layer on top of the semiconductor die for acting as a ground plane or a power plane; and connecting the semiconductor die to the cap layer through a cap bonding wire.

20 Claims, 6 Drawing Sheets

INTEGRATED CIRCUIT PACKAGING SYSTEM WITH CAP LAYER AND METHOD OF MANUFACTURE THEREOF

TECHNICAL FIELD

The present invention relates generally to an integrated circuit packaging system, and more particularly to a package system for a semiconductor package for a small, dense, and cost-effective solution.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which the integrated semiconductor chips are mounted include a substrate or other chip-mounting device. Substrates are parts that provide a package with mechanical base support and a form of electrical interface that would allow the external world to access the devices housed within the package.

One example of such a substrate is a leadframe. A leadframe typically includes at least an area on which an integrated circuit chip is mounted and multiple power, ground, and/or signal leads to which power, ground, and/or signal sites of the integrated semiconductor die are electronically attached. The area on which the integrated circuit is mounted is typically called a die pad. The multiple leads typically form the outer frame of the leadframe. The die pad is typically connected to the outer frame leads by tiebars so that the whole leadframe is a single integral piece of metal.

In some leadframe configurations, the die pad also serves as the ground plane for the semiconductor package. Recent leadframe development such as Quad Frame No Leads configuration is also proposed to increase density and reduce cost.

In typical leadframe packages, the semiconductor die mounted is smaller than or of the same size of the die pad. In such a configuration, the surrounding leads occupy space where there is no functional semiconductor device. Therefore the density of semiconductor devices on the leadframe is limited. The modern trend of the semiconductor manufacturing and packaging is to increase the device density on the leadframe. Therefore such wasted space in the typical leadframe design presents a problem.

An overhang die approach is proposed to solve this problem. In this approach, the semiconductor die is positioned in such a way that the edge portion of the semiconductor die overhangs the leads of the leadframe. The edge portion of the semiconductor may or may not be in contact with the leads. In so doing, the leadframe could be made smaller and the previously wasted space is utilized because that space is now occupied by the edge portion of the semiconductor die.

However, the overhang approach has various problems. One prominent problem is that in such a configuration it is almost impossible to connect the signal sites on the semiconductor chip to the ground pad on the die pad through wire bonding process because of the overhang configuration. This problem seriously undercuts the advantage that the overhang configuration provides.

Thus, a need still remains for accommodating the modern trend of semiconductor manufacturing and packaging, reducing the package footprint, maximizing the die size, increasing the packaging density, and facilitating interconnections within semiconductor packages. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: attaching a semiconductor die to a die pad of a leadframe; forming a cap layer on top of the semiconductor die for acting as a ground plane or a power plane; and connecting the semiconductor die to the cap layer through a cap bonding wire.

The present invention provides an integrated circuit packaging system including: a die pad; a semiconductor die attached to the die pad; a cap layer formed on top of the semiconductor die for acting as a ground plane or a power plane; and a cap bonding wire connecting the semiconductor die to the cap layer.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient details to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings generally show similar orientations for ease of description, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the drawings. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
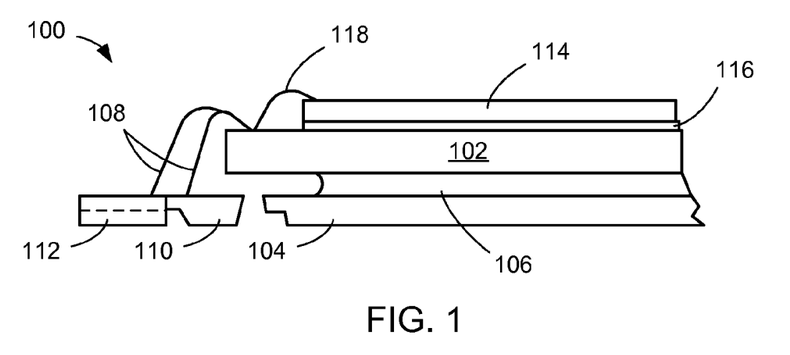
FIG. 1 is a cross-sectional view of a semiconductor package system of a first embodiment of the present invention along line 4-4 of FIG. 4.
Figure 4:
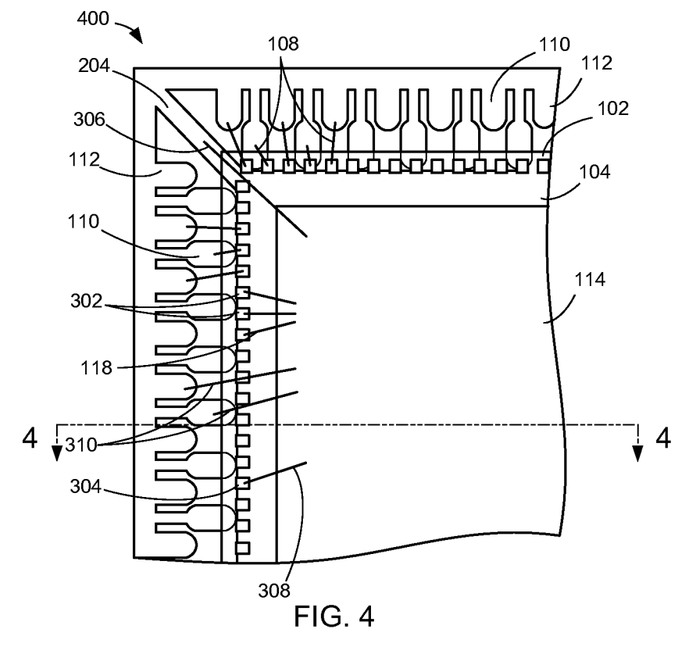
FIG. 4 is a top view of the semiconductor package system of the first embodiment of the present invention after the intermediate stage of the process.

Referring now to FIG. 1, therein is shown a cross-sectional view of a semiconductor package system of a first embodiment of the present invention along line 4-4 of FIG. 4.

A semiconductor package 100 is shown to have a semiconductor die 102 attached to a die pad 104 through a die attach adhesive 106. A lead bonding wire 108 connects the semiconductor die 102 to an inner lead 110 and an outer lead 112. A cap ground plate 114 is attached to the semiconductor die 102 through a cap ground plate adhesive 116. A cap bonding wire 118 connects the cap ground plate 114 to the semiconductor die 102.

The lead bonding wire 108 typically connects the inner lead 110 and the outer lead 112 to various input/output (I/O) sites on the semiconductor die 102.

The inner lead 110 and the outer lead 112 actually occupy staggered positions. They are spaced from and not in contact with each other although the perspective view in FIG. 1 shows that they appear to be in contact with each other.

The semiconductor die 102 overhangs the inner lead 110 and the inner lead 110 laterally extends toward the die pad 104 and laterally beyond a perimeter of the semiconductor die 102. It has been discovered that in so doing, the semiconductor die 102 could be made bigger than the die pad 104, resulting in more functionalities being incorporated into the semiconductor die 102.

The cap ground plate 114 could be made out of an electrically conductive bondable material. The cap ground plate 114 could be a copper plate plated with silver or NiPd. The cap ground plate could also be an aluminized silicon die.

In this embodiment of the present invention, the cap ground plate 114 serves as a ground plane for the semiconductor die 102.

Prior art configurations lack the cap ground plate 114. For prior art package systems having the overhang configuration, connecting the semiconductor die 102 to the die pad 104, which usually serves as the ground plane, is very difficult due to the overhang configuration. It has been found that positioning the cap ground plate 114 on top of the semiconductor die 102 makes it easy and straightforward to connect the semiconductor die 102 to the ground plane, which is the cap ground plate 114 in the current embodiment of the present invention, without sacrificing the overhang configuration.

It has been found that the semiconductor package 100 facilitates ready and easy connection of the semiconductor die 102 to the cap ground plate 114 which serves as a ground plane while maximizing the size of the semiconductor die 102 and hence reduces the manufacturing complexity and increases the functionalities density of the semiconductor package.

Thus, it has been discovered that the integrated circuit packaging system of the present invention furnishes important and heretofore unknown and unavailable solutions, capabilities, and functional aspects for increasing functionality integration, increasing packing density, reducing processing and manufacturing complexity, reducing cost, and enhancing reliability.

It is noted that the practice of the present invention does not necessarily require the overhang configuration.

Figure 2:
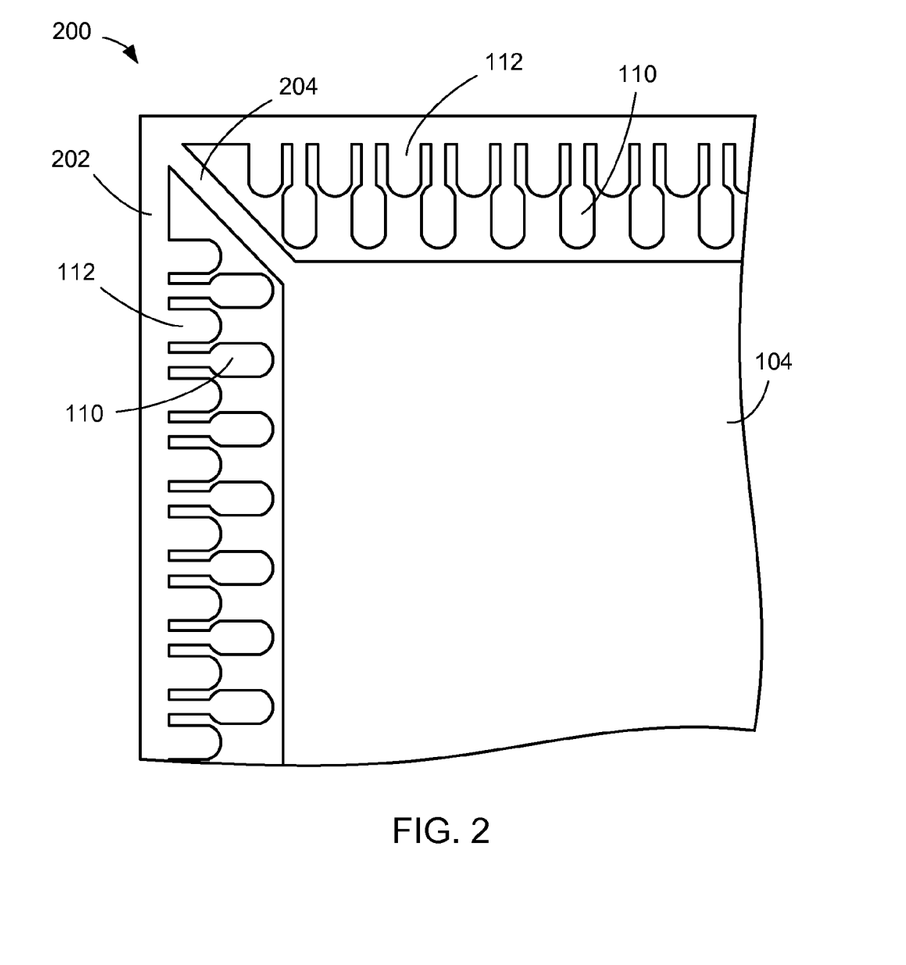
FIG. 2 is a top view of a leadframe of the first embodiment of the present invention at a starting stage of the process.

Referring now to FIG. 2, therein is shown a top view of a leadframe of the first embodiment of the present invention at a starting stage of the process.

At the starting stage of the process a leadframe 200 is shown to have the die pad 104, the inner lead 110, the outer lead 112, and an outer frame 202. A tie bar 204 connects the die pad 104 to the outer frame 202. The inner lead 110 and the outer lead 112 are placed in staggered positions along the outer frame 202.

Figure 3:
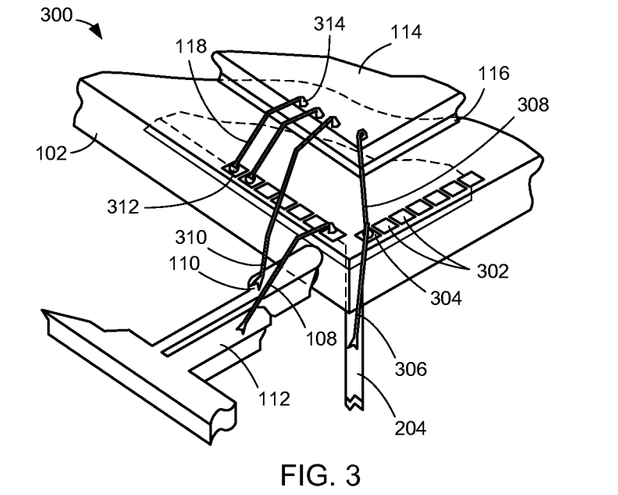
FIG. 3 is an isometric view of the semiconductor package system of the first embodiment of the present invention at an intermediate stage of the process.

Referring now to FIG. 3, therein is shown an isometric view of the semiconductor package system of the first embodiment of the present invention at an intermediate stage of the process.

A semiconductor package 300 is shown to have the semiconductor die 102 and the cap ground plate 114 attached to the semiconductor die 102 through the cap ground plate adhesive 116. A die bonding pad 302 and a die ground pad 304 are shown on the semiconductor die 102.

A tie bar grounding bonding wire 306 connects the tie bar 204 to the die ground pad 304. A die ground bonding wire 308 connects the cap ground plate 114 to the die ground pad 304. It is noted that the tie bar grounding bonding wire 306 could also connects the tie bar 204 directly to the cap ground plate 114.

The lead bonding wire 108 connects the outer lead 112 to the die bonding pad 302. A lead down bonding wire 310 connects the cap ground plate 114 to the inner lead 110. The cap bonding wire 118 connects the cap ground plate 114 to the die bonding pad 302 on the semiconductor die 102. In at least one embodiment, the cap bonding wire 118 can include a first end 312 directly on the semiconductor die 102 (e.g., directly on the die bonding pad 302) and a second end 314 directly on the cap ground plate 114.

In prior art packaging systems, it is difficult to connect the inner lead 110 to the ground plane of the system, which is usually the die pad 104, due to the overhang configuration. It has been found that the lead down bonding wire 108 easily connects the inner lead 110 to the cap ground plate 114 which serves as the ground plane of the system.

Referring now to FIG. 4, therein is shown a top view of the semiconductor package system of the first embodiment of the present invention after the intermediate stage of the process.

A semiconductor package 400 is shown to have the semiconductor die 102, the die pad 104, and the cap ground plate 114. The die bonding pad 302 and the die ground pad 304 are shown on the semiconductor die 102.

The tie bar grounding bonding wire 306 connects the tie bar 204 directly to the cap ground plate 114. The die ground bonding wire 308 connects the cap ground plate 114 to the die ground pad 304.

The lead bonding wire 108 connects the inner lead 110 and the outer lead 112 to the die bonding pad 302. The lead down bonding wire 310 connects the cap ground plate 114 to the inner lead 110 and the outer lead 112. The cap bonding wire 118 connects the cap ground plate 114 to the die bonding pad 302 on the semiconductor die 102.

Figure 5:
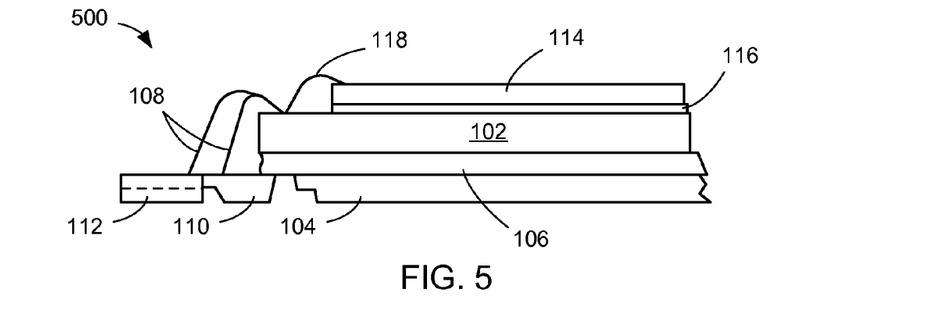
FIG. 5 is a cross-sectional view similar to FIG. 1 of a semiconductor package system of a second embodiment of the present invention.

Referring now to FIG. 5, therein is shown a cross-sectional view similar to FIG. 1 of a semiconductor package system of a second embodiment of the present invention.

A semiconductor package 500 is shown to have the semiconductor die 102 attached to the die pad 104 through the die attach adhesive 106. The lead bonding wire 108 connects the semiconductor die 102 to the inner lead 110 and the outer lead 112. The cap ground plate 114 is attached to the semiconductor die 102 through the cap ground plate adhesive 116. The cap bonding wire 118 connects the cap ground plate 114 to the semiconductor die 102.

The lead bonding wire 108 typically connects the inner lead 110 and the outer lead 112 to various input/output (I/O) sites on the semiconductor die 102.

The inner lead 110 and the outer lead 112 occupy staggered positions. They are spaced from and not in contact with each other although the perspective view in this FIG. 5 shows that they appear to be in contact with each other.

The semiconductor die 102 overhangs and is in contact with the inner lead 110 through the die attach adhesive 106. In so ding, the semiconductor die 102 could be made bigger than the die pad 104, resulting in more functionalities being incorporated into the semiconductor die 102. It has been discovered that the contact between the semiconductor die 102 and the inner lead 110 strengthens the support for the semiconductor die 102 and hence increases the reliability of the package.

The semiconductor package 500 is very similar to the semiconductor package 100 in FIG. 1. In FIG. 1 the semiconductor die 102 overhangs the inner lead 110 and is not in contact with the inner lead 110 while in this FIG. 5 the semiconductor die 102 is in contact with the inner lead 110 through the die attach adhesive 106.

Figure 6:
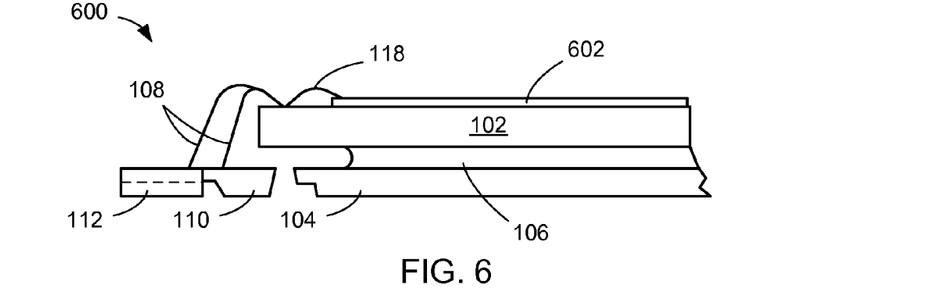
FIG. 6 is a cross-sectional view similar to FIG. 1 of a semiconductor package system of a third embodiment of the present invention.

Referring now to FIG. 6, therein is shown a cross-sectional view similar to FIG. 1 of a semiconductor package system of a third embodiment of the present invention.

A semiconductor package 600 is shown to have the semiconductor die 102 attached to the die pad 104 through the die attach adhesive 106. The lead bonding wire 108 connects the semiconductor die 102 to the inner lead 110 and the outer lead 112.

A cap redistribution layer 602 is formed on top of the semiconductor die 102. The cap bonding wire 118 connects the cap redistribution layer 602 to the semiconductor die 102.

The cap redistribution layer 602 could be formed by a copper passivation process of the top surface of the semiconductor die 102. In this embodiment of the present invention, the cap redistribution layer 602 serves a grounding plane for the semiconductor package 600. The functionality of the cap redistribution layer 602 is the same as the cap ground plate 114 in FIG. 1.

The lead bonding wire 108 typically connects the inner lead 110 and the outer lead 112 to various input/output (I/O) sites on the semiconductor die 102.

The inner lead 110 and the outer lead 112 occupy staggered positions. They are spaced from and not in contact with each other although the perspective view in this FIG. 6 shows that they appear to be in contact with each other.

The semiconductor die 102 overhangs the inner lead 110. In so ding, the semiconductor die 102 could be made bigger than the die pad 104, resulting in more functionalities being incorporated into the semiconductor die 102.

Figure 7:
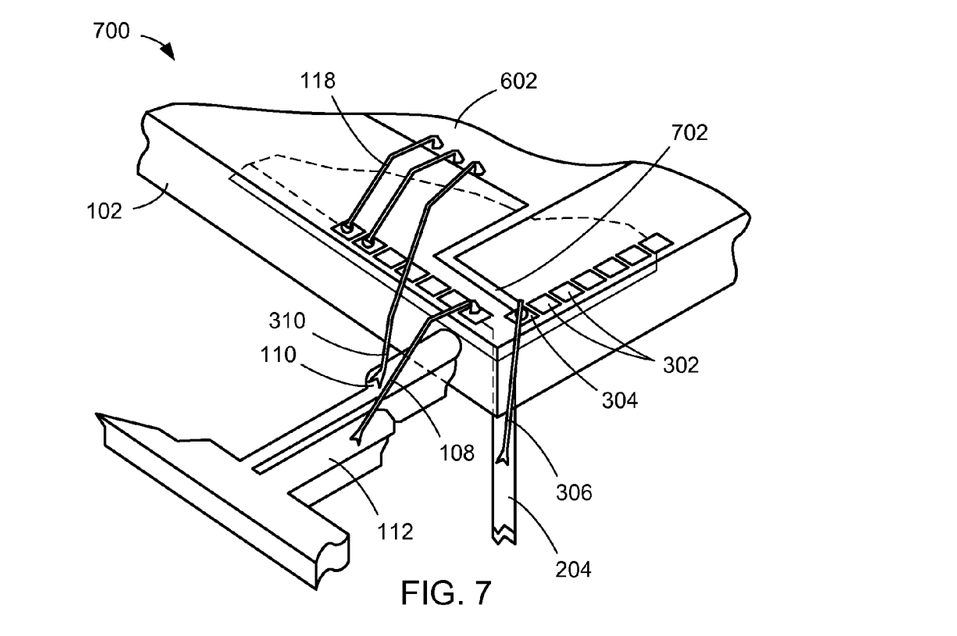
FIG. 7 is an isometric view similar to FIG. 3 of the semiconductor package system of the third embodiment of the present invention after an intermediate stage of the process.

Referring now to FIG. 7, therein is shown an isometric view similar to FIG. 3 of the semiconductor package system of the third embodiment of the present invention after an intermediate stage of the process.

A semiconductor package 700 is shown to have the semiconductor die 102 and the cap redistribution layer 602 formed on top of the semiconductor die 102. The die bonding pad 302 and the die ground pad 304 are shown on the semiconductor die 102.

The tie bar grounding bonding wire 306 connects the tie bar 204 to the die ground pad 304. A cap redistribution layer finger 702 connects the cap redistribution layer 602 to the die ground pad 304. It is noted that the tie bar grounding bonding wire 306 could also connects the tie bar 204 directly to the cap redistribution layer 602.

The lead bonding wire 108 connects the outer lead 112 to the die bonding pad 302. The lead down bonding wire 310 connects the cap redistribution layer 602 to the inner lead 110. The cap bonding wire 118 connects the cap redistribution layer 602 to the die bonding pad 302 on the semiconductor die 102.

Figure 8:
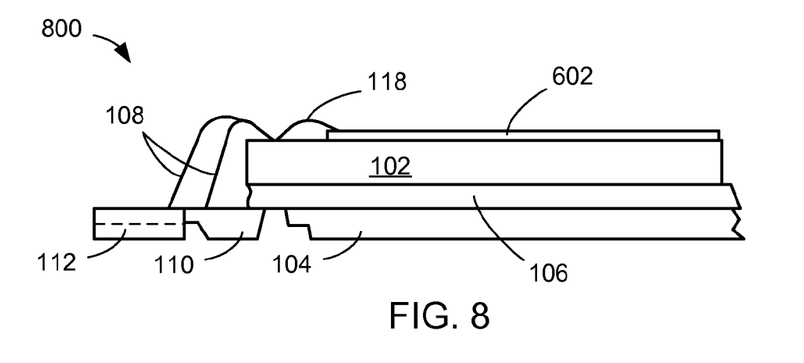
FIG. 8 is a cross-sectional view similar to FIG. 1 of a semiconductor package system of a fourth embodiment of the present invention.

Referring now to FIG. 8, therein is shown a cross-sectional view similar to FIG. 1 of a semiconductor package system of a fourth embodiment of the present invention.

A semiconductor package 800 is shown to have the semiconductor die 102 attached to the die pad 104 through the die attach adhesive 106. The lead bonding wire 108 connects the semiconductor die 102 to the inner lead 110 and the outer lead 112. The cap redistribution layer 602 is formed on top of the semiconductor die 102. The cap bonding wire 118 connects the cap redistribution layer 602 to the semiconductor die 102.

The lead bonding wire 108 typically connects the inner lead 110 and the outer lead 112 to various input/output (I/O) sites on the semiconductor die 102.

The inner lead 110 and the outer lead 112 occupy staggered positions. They are spaced from and not in contact with each other although the perspective view in this FIG. 8 shows that they appear to be in contact with each other.

The semiconductor die 102 overhangs and is in contact with the inner lead 110 through the die attach adhesive 106. In so ding, the semiconductor die 102 could be made bigger than the die pad 104, resulting in more functionalities being incorporated into the semiconductor die 102.

The semiconductor package 800 is very similar to the semiconductor package 600 in FIG. 6. In FIG. 6 the semiconductor die 102 overhangs the inner lead 110 and is not in contact with the inner lead 110 while in this FIG. 8 the semiconductor die 102 is in contact with the inner lead 110 through the die attach adhesive 106.

Figure 9:
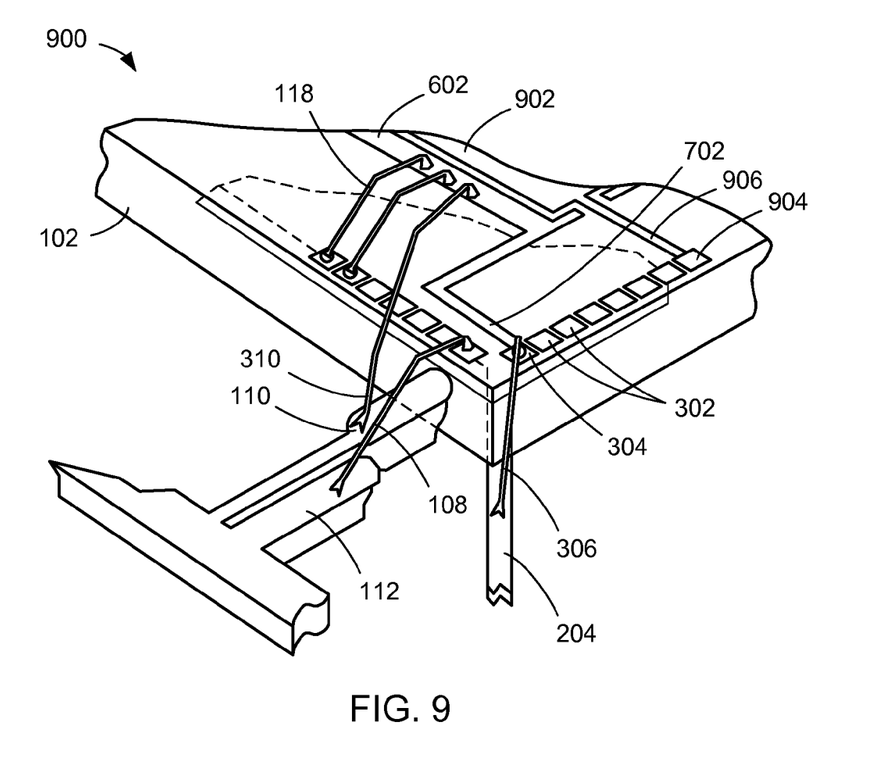
FIG. 9 is an isometric view similar to FIG. 3 of a semiconductor package system of a fifth embodiment of the present invention.

Referring now to FIG. 9, therein is shown an isometric view similar to FIG. 3 of a semiconductor package system of a fifth embodiment of the present invention.

A semiconductor package 900 is shown to have the semiconductor die 102. The cap redistribution layer 602 and a cap power ring 902 are shown to be formed on top of the semiconductor die 102. The die bonding pad 302 and the die ground pad 304 are shown on the semiconductor die 102. A die power pad 904 is also shown on the semiconductor die 102.

The cap redistribution layer 602 and the cap power ring 902 are not in contact with each other. The cap power ring 902 could also be formed by a copper passivation process of the top surface of the semiconductor die 102.

The tie bar grounding bonding wire 306 connects the tie bar 204 to the die ground pad 304. The cap redistribution layer finger 702 connects the cap redistribution layer 602 to the die ground pad 304. A cap power ring finger 906 connects the cap power ring 902 to the die power pad 904.

It is noted that the tie bar grounding bonding wire 306 could also connects the tie bar 204 directly to the cap redistribution layer 602.

The lead bonding wire 108 connects the outer lead 112 to the die bonding pad 302. The lead down bonding wire 310 connects the cap redistribution layer 602 to the inner lead 110. The cap bonding wire 118 connects the cap redistribution layer 602 to the die bonding pad 302 on the semiconductor die 102.

In this embodiment of the present invention the cap power ring 902 serves as the power plane of the semiconductor package 900. It has been discovered that in so doing, other pad sites on the semiconductor die 102 could be freed to serve as other signal pads, resulting in more functionalities being incorporated in the semiconductor die 102.

Figure 10:
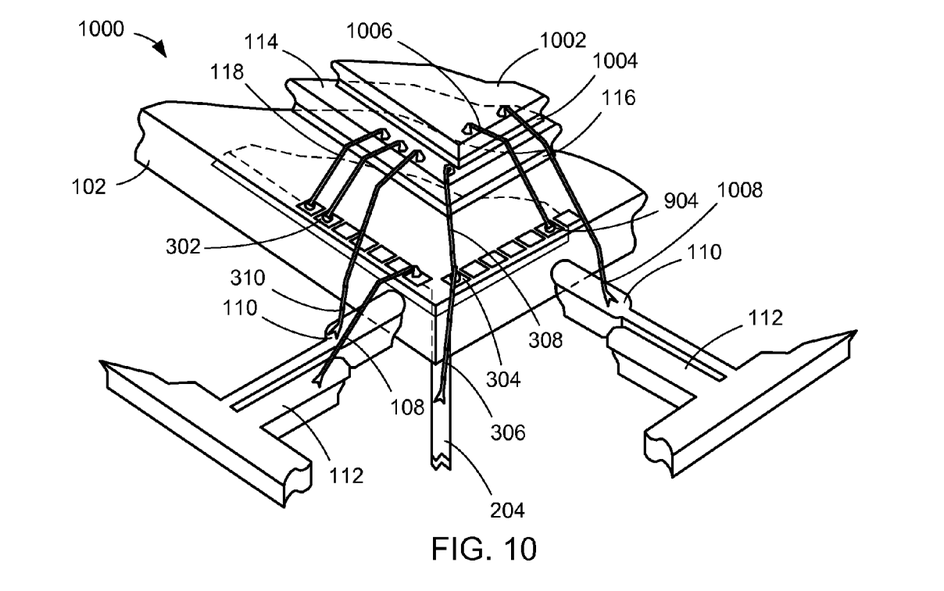
FIG. 10 is an isometric view similar to FIG. 3 of a semiconductor package system of a sixth embodiment of the present invention.

Referring now to FIG. 10, therein is shown an isometric view similar to FIG. 3 of a semiconductor package system of a sixth embodiment of the present invention.

A semiconductor package 1000 is shown to have the semiconductor die 102 and the cap ground plate 114 attached to the semiconductor die 102 through the cap ground plate adhesive 116. A cap power plate 1002 is attached to the cap ground plate 114 through a cap power plate adhesive 1004.

The die bonding pad 302, the die ground pad 304, and the die power pad 904 are shown on the semiconductor die 102.

A tie bar grounding bonding wire 306 connects the tie bar 204 to the die ground pad 304. The die ground bonding wire 308 connects the cap ground plate 114 to the die ground pad 304. It is noted that the tie bar grounding bonding wire 306 could also connects the tie bar 204 directly to the cap ground plate 114.

The lead bonding wire 108 connects the outer lead 112 to the die bonding pad 302. The lead down bonding wire 310 connects the cap ground plate 114 to the inner lead 110. The cap bonding wire 118 connects the cap ground plate 114 to the die bonding pad 302 on the semiconductor die 102.

A cap power bonding wire 1006 connects the cap power plate 1002 to the die power pad 904. A cap power lead down bonding wire 1008 connects the cap power plate 1002 to the inner lead 110.

In this embodiment of the present invention the cap power plate 1002 serves as the power plane of the semiconductor package 1000. It has been discovered that in so doing, other pad sites on the semiconductor die 102 could be freed to serve as other signal pads, resulting in more functionalities being incorporated in the semiconductor die 102.

Figure 11:
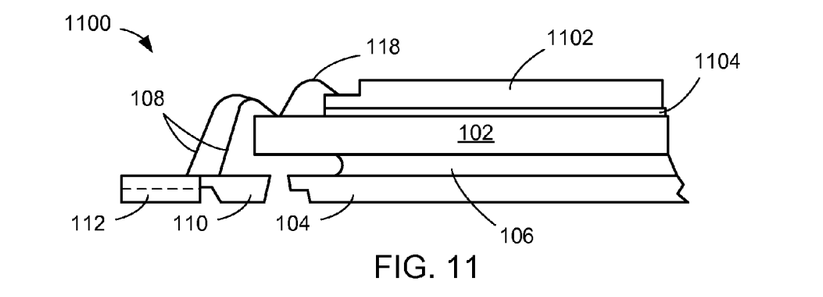
FIG. 11 is a cross-sectional view similar to FIG. 1 of a semiconductor package system of a seventh embodiment of the present invention.

Referring now to FIG. 11, therein is shown a cross-sectional view similar to FIG. 1 of a semiconductor package system of a seventh embodiment of the present invention.

A semiconductor package 1100 is shown to have the semiconductor die 102 attached to the die pad 104 through the die attach adhesive 106. The lead bonding wire 108 connects the semiconductor die 102 to the inner lead 110 and the outer lead 112.

A cap heat sink 1102 is attached to the semiconductor die 102 through a cap heat sink adhesive 1104. The cap bonding wire 118 connects the cap heat sink 1102 to the semiconductor die 102.

The lead bonding wire 108 typically connects the inner lead 110 and the outer lead 112 to various input/output (I/O) sites on the semiconductor die 102.

The inner lead 110 and the outer lead 112 actually occupy staggered positions. They are spaced from and not in contact with each other although the perspective view in this FIG. 11 shows that they appear to be in contact with each other.

The semiconductor die 102 overhangs the inner lead 110. In so ding, the semiconductor die 102 could be made bigger than the die pad 104, resulting in more functionalities being incorporated into the semiconductor die 102.

It has been found that by placing the cap heat sink 1102 at the top of the semiconductor package 1100, the area of the cap heat sink 1102 could be maximized to optimize the heat dissipation from the semiconductor package 1100, resulting in faster cooling of the semiconductor package 1100 and hence increasing the reliability.

Figure 12:
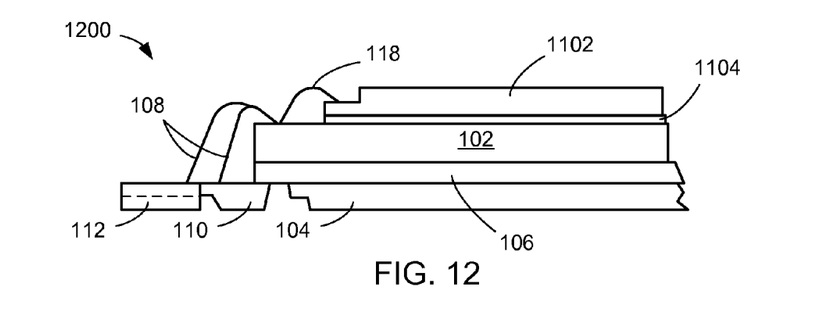
FIG. 12 is a cross-sectional view similar to FIG. 1 of a semiconductor package system of an eighth embodiment of the present invention.

Referring now to FIG. 12, therein is shown a cross-sectional view similar to FIG. 1 of a semiconductor package system of an eighth embodiment of the present invention.

A semiconductor package 1200 is shown to have the semiconductor die 102 attached to the die pad 104 through the die attach adhesive 106. The lead bonding wire 108 connects the semiconductor die 102 to the inner lead 110 and the outer lead 112.

The cap heat sink 1102 is attached to the semiconductor die 102 through the cap heat sink adhesive 1104. The cap bonding wire 118 connects the cap heat sink 1102 to the semiconductor die 102.

The lead bonding wire 108 typically connects the inner lead 110 and the outer lead 112 to various input/output (I/O) sites on the semiconductor die 102.

The inner lead 110 and the outer lead 112 actually occupy staggered positions. They are spaced from and not in contact with each other although the perspective view in this FIG. 12 shows that they appear to be in contact with each other.

The semiconductor die 102 overhangs and is in contact with the inner lead 110 through the die attach adhesive 106. In so ding, the semiconductor die 102 could be made bigger than the die pad 104, resulting in more functionalities being incorporated into the semiconductor die 102.

By placing the cap heat sink 1102 at the top of the semiconductor package 1200, the area of the cap heat sink 1102 could be maximized to optimize the heat dissipation from the semiconductor package 1200, resulting in faster cooling of the semiconductor package 1200 and hence increasing the reliability.

The semiconductor package 1200 is very similar to the semiconductor package 1100 in FIG. 11. In FIG. 11 the semiconductor die 102 overhangs the inner lead 110 and is not in contact with the inner lead 110 while in this FIG. 12 the semiconductor die 102 is in contact with the inner lead 110 through the die attach adhesive 106.

Figure 13:
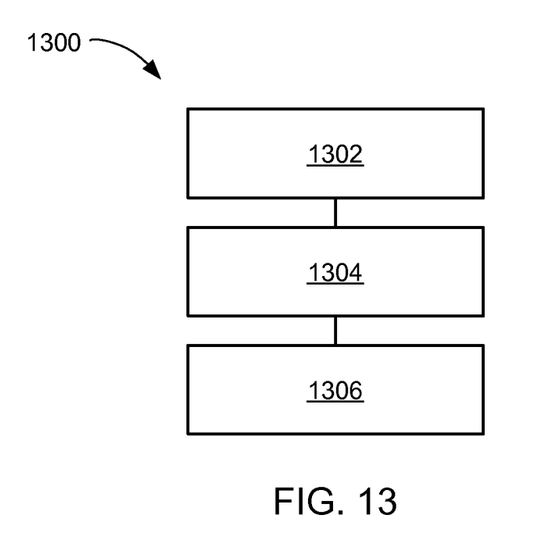
FIG. 13 is a flow chart of a method of manufacture of an integrated circuit packaging system in a further embodiment of the present invention.

Referring now to FIG. 13, therein is shown a flow chart of a method 1300 of manufacture of an integrated circuit packaging system in a further embodiment of the present invention. The method 1300 includes: attaching a semiconductor die to a die pad of a leadframe in a block 1302; forming a cap layer on top of the semiconductor die for acting as a ground plane or a power plane in a block 1304; and connecting the semiconductor die to the cap layer through a cap bonding wire in a block 1306.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing semiconductor packaging systems fully compatible with conventional manufacturing processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    attaching a semiconductor die to a die pad of a leadframe, the leadframe includes an inner lead laterally extending towards the die pad and laterally extending beyond a perimeter of the semiconductor die;
    attaching a cap layer to the semiconductor die for acting as a ground plane; and
    connecting the semiconductor die to the cap layer through a bonding wire, the bonding wire including a first end directly on a die pad of the semiconductor die and a second end directly on the cap layer.

2. The method as claimed in claim 1 wherein attaching the semiconductor die includes attaching a semiconductor die for overhanging the inner lead of the leadframe.

3. The method as claimed in claim 1 wherein attaching the semiconductor die includes attaching a semiconductor die for overhanging the inner lead of the leadframe and is in contact with the inner lead through a die attach adhesive.

4. The method as claimed in claim 1 wherein attaching the cap layer includes attaching a cap ground plate to the semiconductor die through a cap ground plate adhesive for acting as the ground plane of the packaging system.

5. The method as claimed in claim 1 further comprising forming a cap power ring over the semiconductor die for acting as the power plane of the packaging system.

6. A method of manufacture of an integrated circuit packaging system comprising:
    attaching a semiconductor die to a die pad of a leadframe, the semiconductor die overhanging an inner lead positioned along an outer frame of the leadframe, the inner lead laterally extending towards the die pad and laterally extending beyond a perimeter of the semiconductor die;
    attaching a cap layer to the semiconductor die for acting as a ground plane;
    connecting the semiconductor die to the cap layer through a bonding wire, the bonding wire including a first end directly on a die pad of the semiconductor die and a second end directly on the cap layer; and
    removing the outer frame of the leadframe.

7. The method as claimed in claim 6 wherein attaching the cap layer includes forming a cap redistribution layer through a process of passivation of the top surface of the semiconductor die for acting as the ground plane of the packaging system.

8. The method as claimed in claim 6 further comprising:
    attaching a cap power plate to the cap layer through a cap power plate adhesive.

9. The method as claimed in claim 6 further comprising:
    connecting the cap layer to the inner lead through a lead down bonding wire.

10. The method as claimed in claim 6 further comprising:
    connecting the cap layer to a die ground pad on the semiconductor die through a die ground bonding wire.

11. An integrated circuit packaging system comprising:
    a die pad;
    a semiconductor die attached to the die pad;
    an inner lead laterally extending towards the die pad and laterally extending beyond a perimeter of the semiconductor die;
    a cap layer attached to the semiconductor die for acting as a ground plane; and
    a bonding wire connecting the semiconductor die to the cap layer, the bonding wire including a first end directly on a die pad of the semiconductor die and a second end directly on the cap layer.

12. The system as claimed in claim 11 wherein the semiconductor die overhangs the inner lead.

13. The system as claimed in claim 11 wherein the semiconductor die overhangs the inner lead and is in contact with the inner lead through a die attach adhesive.

14. The system as claimed in claim 11 wherein the cap layer is a cap ground plate attached to the semiconductor die through a cap ground plate adhesive for acting as the ground plane of the packaging system.

15. The system as claimed in claim 11 further comprising a cap power ring formed over the semiconductor die for acting as the power plane of the packaging system.

16. The system as claimed in claim 11 further comprising: the inner lead overhung by the semiconductor die.

17. The system as claimed in claim 16 wherein the cap layer is a cap redistribution layer formed through a process of passivation of the top surface of the semiconductor die for acting as the ground plane of the packaging system.

18. The system as claimed in claim 16 further comprising:
a cap power plate attached to the cap layer through a cap power plate adhesive.

19. The system as claimed in claim 16 wherein the cap layer and a cap power ring are formed on the semiconductor die.

20. The system as claimed in claim 16 further comprising:
a tie bar grounding bonding wire connecting a die ground pad on the semiconductor die to a tie bar.

* * * * *